United States Patent [19]

Esaki et al.

[11] 4,250,515
[45] Feb. 10, 1981

[54] HETEROJUNCTION SUPERLATTICE WITH POTENTIAL WELL DEPTH GREATER THAN HALF THE BANDGAP

[75] Inventors: Leo Esaki, Chappaqua; Raphael Tsu, Mt. Kisco; George A. Sai-Halasz; Leroy L. Chang, both of Lake Mohegan, all of N.Y.

[73] Assignee: The United States of America as represented by the Secretary of the Army, Washington, D.C.

[21] Appl. No.: 914,098

[22] Filed: Jun. 9, 1978

[51] Int. Cl.$^3$ .................. H01L 29/205; H01L 47/00
[52] U.S. Cl. .......................................... 357/16; 357/4; 357/61
[58] Field of Search .................... 357/4, 16, 12

[56] References Cited

U.S. PATENT DOCUMENTS

| | | | |
|---|---|---|---|
| 3,626,257 | 12/1971 | Esaki et al. | 357/16 |
| 4,103,312 | 7/1978 | Chang et al. | 357/16 |
| 4,137,542 | 1/1979 | Chang et al. | 357/16 |

OTHER PUBLICATIONS

Sai-Halasz et al., Applied Physics Letters, 30 pp. 651-653 (15 Jun. 1977).

*Primary Examiner*—William D. Larkins
*Attorney, Agent, or Firm*—Nathan Edelberg; Sheldon Kanars; Jeremiah G. Murray

[57] ABSTRACT

A superlattice structure is disclosed in which alternating layers of semiconductor alloy materials provide a one dimensional spatial periodic variation in band edge energy. A first layer of the superlattice device is an alloy including a first Group III material and a first Group V material, preferably In As, while the second layer is an alloy including a second Group III material different from the first Group III material and a second Group V material different from the first Group V material, and preferably GaSb. In the superlattice structure the valence band of the second alloy is closer to the conduction band of the first alloy than it is to the valence band of the first alloy.

6 Claims, 2 Drawing Figures

HETEROJUNCTION SUPERLATTICE WITH POTENTIAL WELL DEPTH GREATER THAN HALF THE BANDGAP

The invention described herein may be manufactured and used by or for the government for governmental purposes without the payment of any royalties thereon or therefor.

FIELD OF THE INVENTION

This invention relates to semiconductor negative resistance devices, and particularly to semiconductor negative resistance superlattice devices.

BACKGROUND OF THE INVENTION

In U.S. Pat. No. 3,626,257, (the Esaki patent) in which two of the inventors hereof, Leo Esaki and Raphael Tsu, are coinventors, there is disclosed a new class of devices which exhibited a DC negative resistance. The new class of devices were referred to as semiconductor devices with a superlattice region. The aforesaid patent taught that by producing a device having a portion (a superlattic region) which exhibits a periodic potential difference from that of a uniform crystal lattice for the carriers of the material to interact with, a high-frequency bulk negative resistance device could be achieved.

The Esaki patent taught that a superlattice region could be produced by either doping or alloying techniques. The alloying referred to in the Esaki patent contemplated a first layer of a first material or alloy and a second layer which was an alloy which had as a constituent part thereof, the original material or alloy. From this type of alloying procedure, a periodic electron energy vs. distance characteristic was developed as shown in FIG. 3 of the Esaki patent. It will be noted that alloying of the materials specified in the Esaki patent results in the adjustment of the gap energy between alternate layers such that if the conduction band is raised, the valence band is lowered. The alloy type superlattice structures disclosed in the Esaki patent relied upon interactions between the conduction bands to produce a negative resistance.

The alloy type superlattice structures disclosed in the Esaki patent required higher current levels (higher fields) before the negative resistance region is reached. Thus, large DC bias power is required to obtain the negative resistance characteristic. As a result, the ratio of signal power to bias power is low.

As mentioned above, the Esaki patent also discusses the construction of superlattice regions employing alternately doped layers, the energy level diagrams of which are shown in FIG. 2 of the Esaki patent. It is now believed that practical superlattice structures cannot be effectively constructed by doping techniques since in order to produce the energy vs. distance characteristic desired, such heavy doping is required that it reduces mobility of the carriers to a point that the interactions contemplated may not occur.

BRIEF DESCRIPTION OF THE INVENTION

In accordance with the teachings of this invention, an improved superlattice structure is provided in which the negative resistance region is produced at a lower current level than the heretofore disclosed superlattice structures, resulting in a more efficient superlattice structure. The improved superlattice structure comprises alternate layers of first and second semiconductor alloys wherein the first layer is an alloy including a first Group III material and a first Group V material, and the second layer is an alloy including a second Group III material different from the first Group III material, and a second Group V material different from the first Group V material, and the valence band of the second alloy is closer to or over overlaps the conduction band of the first alloy than it is to the valence band of the first alloy.

In the preferred embodiment, the first Group III material is In, the first Group V material is As, the second Group III material is Ga, and the second Group V material is Sb. In accordance with a further aspect of this invention, each of the layers can include additional material in the alloys.

DESCRIPTION OF THE DRAWINGS

For a more complete understanding of the invention, reference should be made to the following detailed description and drawings in which.

DETAILED DESCRIPTION OF THE INVENTION

Figure 1:
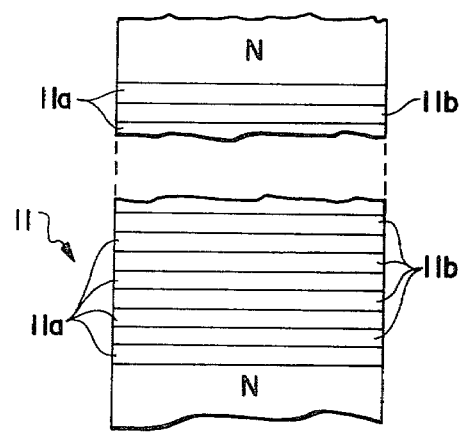
FIG. 1 is a schematic showing a semiconductor device including a negative resistance superlattice region in accordance with the principles of this invention.

Referring now to FIG. 1, we see a device which includes a superlattice region 11 composed of a series of heterojunctions formed by alternating layers 11a and 11b. The layer 11a is an alloy of a first Group III material and a first Group V material. The layer 11b is an alloy of a second Group III material different from the first Group III material and a second Group V material different from the first Group V material. In the preferred embodiments the layer 11a is an alloy of In As, and preferably an alloy of $In_{1-x}Ga_xAs$, while the layer 11b is an alloy of GaSb and preferably an alloy of $GaSb_{1-y}As_y$.

The parameters y and x can be related in a preferred embodiment to obtain perfect lattice matching by the relationship:

$$y = 0.918x + 0.082.$$

The layers 11a and 11b can advantageously, in the preferred embodiment, each be between 30 and 60 angstroms thick.

The device of FIG. 1 can be manufactured by molecular beam epitaxy. A system useful in growing an alloy semiconductor having a superlattice region of this invention can be constructed similar to the one described for GaAs and AlAs, by L. L. Chang, L. Esaki, W. E. Howard, R. Ludeke and N. Schul in the Journal, J. Vac. Sci. Technol. 10, 655 (1973) with the exception of its having effusion cells containing elemental sources of the elements In, Ga, Sb and As, and of the dopent Sn. The substrates used include (100) oriented GaAs, InAs or GaSb. Chemically polished substrates should be degreased and etched prior to loading and subsequently $Ar^+$ bombarded and annealed in an ambient of the corresponding group-V element in the molecular beam epitaxy system. The deposition temperature should be between 450° and 600° C., and the growth rate between one and three angstroms per second. The growth rate is determined by the arrival rates of the Group III elements. For a more complete discussion see InGaAs. Heterodyne Junction by Molecular Beam Epitaxy by H. Sakaki, L. L. Chang, R. Ludeke, C. A. Chang, G. A. Sai-Halsz, and L. Esaki; Appl. Phys, Lett. 31, 211 (1977), and MBE of InGaAs and GaSbAs, by C. A. Chang, R. Ludeke, L. Chang and L. Esaki, Appl. Phys, Lett. 31, 759 (1977).

Figure 2:
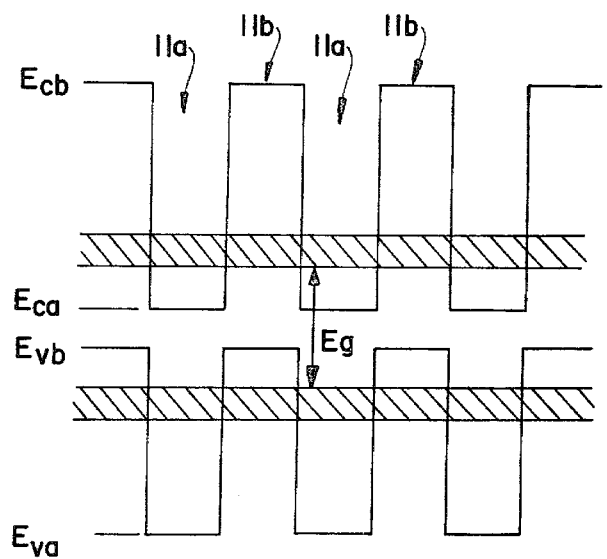
FIG. 2 is a representation of the energy diagram of the superlattice portion of the device of FIG. 1.

FIG. 2 shows the energy level, in the superlattice region of FIG. 1. The dark solid lines show the energy levels in the individual alloys. It should be noted that the conduction band $E_{ca}$ of the layer 11a is closer to the valence band $E_{vb}$ of the layer 11b than it is to the conduction band $E_{cb}$ of the layer 11b, or to the valence band $E_{va}$ of the layer 11a. The distance between $E_{ca}$ and $E_{vb}$ can be varied by varying the layers alloy content. Additionally, the value $E_g$ can be varied by varying either the thickness of the layers or their alloy content, or both. This flexibility is not possible in alloy structures of the type taught in U.S. Pat. No. 3,626,257, mentioned above since the use of the same base alloying materials constricts the possible energy levels of the adjacent materials such that the conduction band of the two layers are always closer to each other than they are to the valence band of the other layer. As a result of the present invention, the conduction band of the layer 11a and the valence band of the layer 11b create interactions with carriers to produce a negative resistance characteristic at a much lower current level than in the devices described in U.S. Pat. No. 3,626,257. As a result, the ratio of signal current to the bias current is increased.

The resultant energy structure produced when the layers 11a and 11b are adjacent to each other as in FIG. 1 is shown in the hatched lines in FIG. 2. The energy gap depends strongly on the thickness of the layers 11a and 11b. It can also be altered by varying the alloy composition. It has been found that the thinner the layers the larger the energy gap. The thinnest layers produce a gap of about 0.6eV decreasing to much smaller values as the thickness increases. Thus it is possible to synthesize a tailor-made semiconductor with an electron band structure which bears little resemblance to the host semiconductor.

While this invention has been described with respect to a particular embodiment thereof, numerous others will become obvious to those of ordinary skill in the art in the light hereof. There are other Group III and Group V elements that can be substituted for the ones particularly disclosed to obtain varying energy distributions in superlattice structures.

What is claimed is:

1. A semiconductor superlattice structure comprising: first and second different semiconductor materials forming a plurality of alternate layers, each interfaced to its adjacent layer in a semiconductor heterojunction; each said layer having a thickness of from 30 to 60 angstroms; the bottom of the conduction bands of said first and second materials being at different energy levels and the tops of said valence bands of said first and second materials being at different energy levels; the bottoms of said conduction bands of said first and second materials forming a plurality of serially arranged potential wells and barriers; said potential wells and barriers caused by differences in the band structures of said different materials forming said alternate layers and the interfacing of said layers in said heterojunctions; and the distance between the bottoms of said potential wells in said conduction band and the tops of said potential wells in said valence band being less than the depth of said potential wells.

2. The semiconductor superlattice structure according to claim 1 wherein said first semiconductor material is an alloy including a first Group III material and a first Group V material and said second material is an alloy including a second Group III material different from said first Group III material and a second Group V material different from said first Group V material.

3. The semiconductor superlattice structure as defined in claim 2, in which said first Group III material is In, said first Group V material is As, said second Group III material is Ga, and said second Group V material is Sb.

4. The semiconductor superlattice structure as defined in claim 2, in which the first layer is an alloy of $In_{1-x}Ga_xAs$ and the second layer is an alloy of $GaSb_{1-y}As_y$, and wherein $y=0.918x+0.082$.

5. The semiconductor superlattice structure according to claim 1 and wherein the bottoms of said potential wells in said conduction band are at a higher energy level than the tops of said potential wells in said valance band.

6. The semiconductor superlattice structure according to claim 1 and wherein said tops and bottoms of said potential wells in said valance and conduction bands respectively overlap, with said valance-band potential well tops being at a level between the bottoms of said potential wells and the tops of said potential barriers in said conduction band, and said conduction-band potential well bottoms being at a level between the tops of said potential wells and bottoms of said potential barriers in said valance band; and said potential wells in said conduction band being located in said layers formed by said first material and said potential wells in said valance band being located in said layers formed by said second material.

* * * * *